United States Patent [19]
Deguchi

[11] Patent Number: 6,153,450
[45] Date of Patent: Nov. 28, 2000

[54] METHOD OF UTILIZING FUSES TO SELECT ALTERNATIVE MODULES IN A SEMICONDUCTOR DEVICE

[75] Inventor: Kimihiko Deguchi, Kanagawa-ken, Japan

[73] Assignee: Kabushiki Kaisha Toshiba, Tokyo, Japan

[21] Appl. No.: 09/240,786

[22] Filed: Jan. 25, 1999

Related U.S. Application Data

[62] Division of application No. 08/877,489, Jun. 17, 1997, Pat. No. 5,895,942.

[30] Foreign Application Priority Data

Jun. 18, 1996 [JP] Japan ..................................... 8-156966

[51] Int. Cl.⁷ ................................................. H01L 21/82
[52] U.S. Cl. ........................ 438/130; 438/132; 438/129; 438/467; 438/598; 438/599; 438/601; 438/6; 438/18
[58] Field of Search .................................. 438/130, 132, 438/18, 10, 6, 129, 467, 598, 599, 601

[56] References Cited

U.S. PATENT DOCUMENTS

| | | |
|---|---|---|
| 4,703,436 | 10/1987 | Varshney . |
| 4,933,738 | 6/1990 | Orbach et al. . |
| 5,366,906 | 11/1994 | Wojnarowski et al. ................... 438/17 |
| 5,446,310 | 8/1995 | Baliga et al. ............................ 257/529 |
| 5,459,342 | 10/1995 | Nogami et al. . |
| 5,970,346 | 10/1999 | Liaw ........................................ 438/281 |
| 5,994,170 | 11/1999 | Pedersen et al. ....................... 438/131 |

FOREIGN PATENT DOCUMENTS 6232336  8/1994  Japan .

*Primary Examiner*—David Hardy
*Assistant Examiner*—N. Drew Richards
*Attorney, Agent, or Firm*—Pillsbury Madison & Sutro LLP

[57] ABSTRACT

A semiconductor device according to the present invention is formed on a semiconductor chip and has a common module and a plurality of selectable modules. Each selectable module on the semiconductor chip performs a defined function and has a separate input power terminal. The device also has a voltage pad for connecting to a first voltage source having a first voltage level, so that the voltage pad supplies power to the input power terminal of each selectable module. The output of each selectable module may be connected to one common output pad, or alternatively, may be connected to a dedicated output pad. Also connected to each selectable module is a die/sort pad used for disconnecting a corresponding selectable module from the first voltage source. In the wiring between the first voltage source and the selectable modules, there is provided a plurality of fuses, each fuse having first and second terminals. The first terminal of the fuse is connected to the input power terminal of the corresponding selectable module and the corresponding die/sort pad. The second terminal of the fuse is connected to the voltage pad. Base on the customized specification provided, certain selectable modules may be made inoperable by disconnecting the input power. This is achieved by applying a second voltage source, such as a ground voltage, to one or more of the die/sort pads corresponding to the unused selectable modules.

11 Claims, 5 Drawing Sheets

CHIP BEFORE DIE SORTING TEST

1; CIRCUIT HAVING CHARACTERISTICS A
2; CIRCUIT HAVING CHARACTERISTICS B

METHOD OF UTILIZING FUSES TO SELECT ALTERNATIVE MODULES IN A SEMICONDUCTOR DEVICE

This is a divisional of application Ser. No. 08/877,489, filed Jun. 17, 1997, now U.S. Pat. No. 5,895,942.

BACKGROUND OF THE INVENTION

1. Field of the Invention

The present invention relates to a semiconductor device and a method of manufacturing the same, and more particularly to a semiconductor device having internal modules, each module having a different function, in which any combination of modules are selectable during a die sorting test step.

2. Description of Related Art

A conventional method of manufacturing a semiconductor device includes designing and developing circuits based on certain specifications provided by a customer. Alternatively, a semiconductor device may be manufactured by fabricating circuit is elements or modules on a semiconductor chip and wiring the circuit elements based on the specification provided by a customer. The semiconductor device manufactured by the latter of the above methods is referred to as a custom-designed product.

All the processing steps carried out to fabricate circuit elements on the semiconductor chip are the same for each group of custom-designed products. During the aluminum wiring step, which is carried out after the circuit element forming step, circuit elements previously developed and fabricated that meet the specification are selectively wired to each other, thus resulting in a customized product.

Conventionally, for custom-designed products, aluminum master slicing and mask trimming steps have been used as part of the wiring step. The aluminum master slicing and the mask trimming differ from each other in the following aspects. In the aluminum master slicing, circuit elements corresponding to a particular specification are connected to each other during the first aluminum layer wiring step. Functional blocks formed on a semiconductor chip corresponding to the specification are connected to each other in the second aluminum layer wiring step. On the other hand, in the mask trimming, the first aluminum layer wiring step and the previous steps are made common. The circuit element characteristics are then evaluated. Thereafter, the circuit element characteristics are adjusted, so as to meet the customized specification in the second aluminum layer wiring step based on the evaluation result. The mask trimming may be, in some cases, performed even for products other than the custom-designed product.

With the custom-designed process described above, reliable semiconductor devices are more efficiently manufactured, as compared with a case where the device is manufactured from a basic circuit design. However, in the above-described method, it is necessary to use a wiring pattern corresponding to the customized specification and to evaluate the integrity of the wiring pattern. In particular, as shown in a flow chart of FIG. 1, product A or product B must be manufactured by selecting circuit elements for each product after carrying out the circuit element forming step. In addition, the aluminum wiring step is used on each semiconductor product using an aluminum wiring pattern designed in accordance to the customized specification.

Accordingly, the costs for designing and producing a mask (reticle) for forming an aluminum wiring based on the customized specification is substantial. In addition to the different aluminum wiring step, customized subsequent processing steps are required, thus increasing costs and processing time (generally, it takes several weeks to fabricate a customized semiconductor chip).

The present invention solves the above-described problems by providing a semiconductor device having a desired characteristic which can be supplied in a reduced time in response to customized specifications. This is achieved by initially having several types of custom circuit elements having independent functions in the semiconductor device and then disconnecting the unused circuit elements. This may be achieved by a program setting operation of a tester in a die sorting test.

SUMMARY OF THE DISCLOSURE

A semiconductor device according to the present invention is formed on a semiconductor substrate and has a common module and a plurality of selectable modules. Each selectable module on the semiconductor chip performs a different function and has a separate input power terminal. The device also has a voltage pad connected to a first voltage source outputting a first voltage level, such as a VCC, so that the voltage pad supplies power to the input power terminal of each selectable module. The output of each selectable module may be connected to one output pad, or alternatively, may be connected to a dedicated output pad. Also connected to each selectable module is a die/sort pad used for disconnecting the corresponding selectable module from the first voltage source.

In the wiring between the first power source and the selectable modules, there is provided a plurality of fuses, each fuse having first and second terminals. The first terminal of the fuse is connected to the input power terminal of the corresponding selectable module and the corresponding die/sort pad. The second terminal of the fuse is connected to the voltage pad. Base on the customized specification, the selectable modules may be made inoperable by disconnecting the input power. This is achieved by applying a second voltage source, such as a ground voltage, to one or more of the die/sort pads corresponding to the unused selectable modules.

In a method of manufacturing a semiconductor device on a semiconductor chip, the following steps may be taken. First, a plurality of selectable modules are fabricated on the semiconductor chip, each selectable module being capable of performing a different function. Next, a voltage pad for supplying a power source to the plurality of selectable modules is fabricated. Then, power supplying wires from the voltage pad to each selectable module are formed, in which the power supplying wiring includes a fuse for each corresponding selectable module. In addition, a plurality of die/sort pads connected to each fuse are formed preferably at the outside of the semiconductor chip. During the die/sort testing step, a predetermined voltage is supplied to at least one of the die/sort pads to disconnect the fuse corresponding to a selectable module which is unused by the customized specification. As a result, the selectable module corresponding to the disconnected fuse becomes inoperable.

The foregoing and other objects, features, aspects and advantages of the present invention will become more apparent from the following detailed description of the present invention when taken in conjunction with the accompanying drawings.

BRIEF DESCRIPTION OF THE DRAWINGS

A detailed description of embodiments of the present invention will be made with reference to the accompanying drawings, wherein like numerals designate corresponding parts in the several figures.

DETAILED DESCRIPTION OF THE PREFERRED EMBODIMENTS

Figure 1:
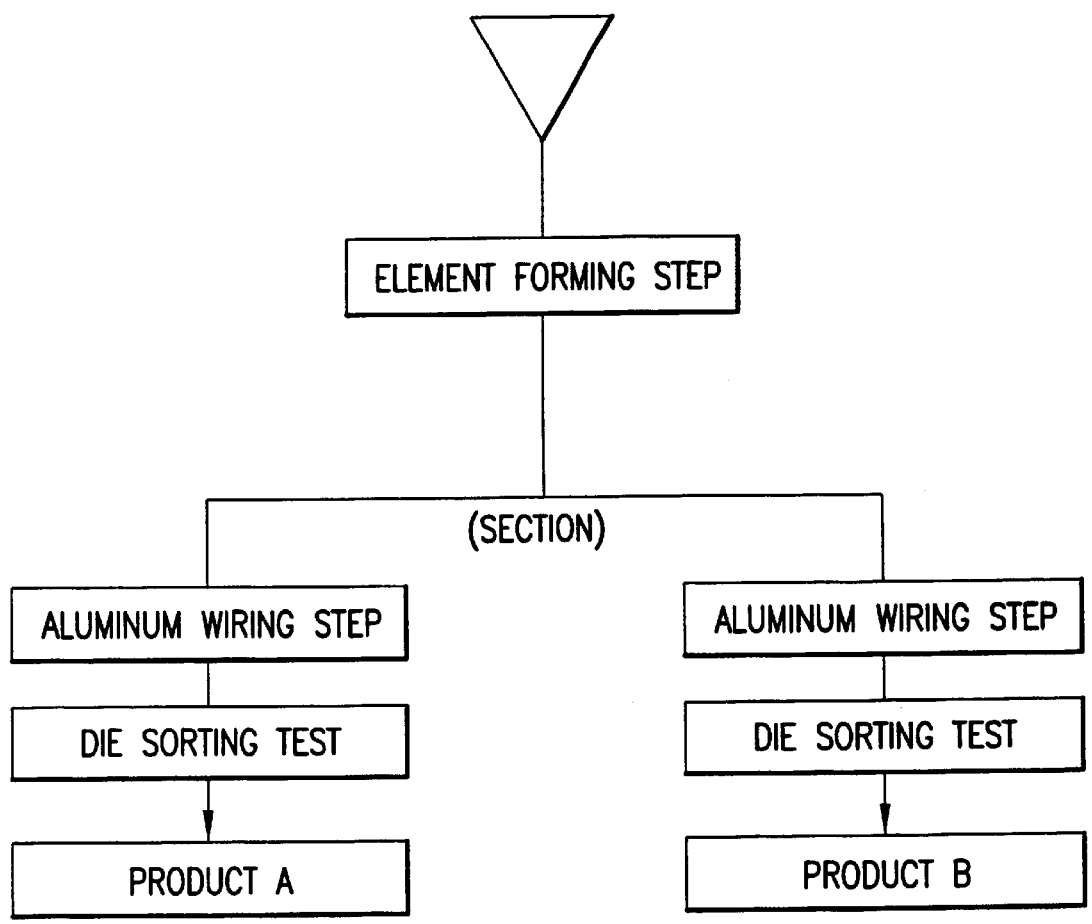
FIG. 1 is a flow chart showing conventional semiconductor device manufacturing steps.
Figure 2:
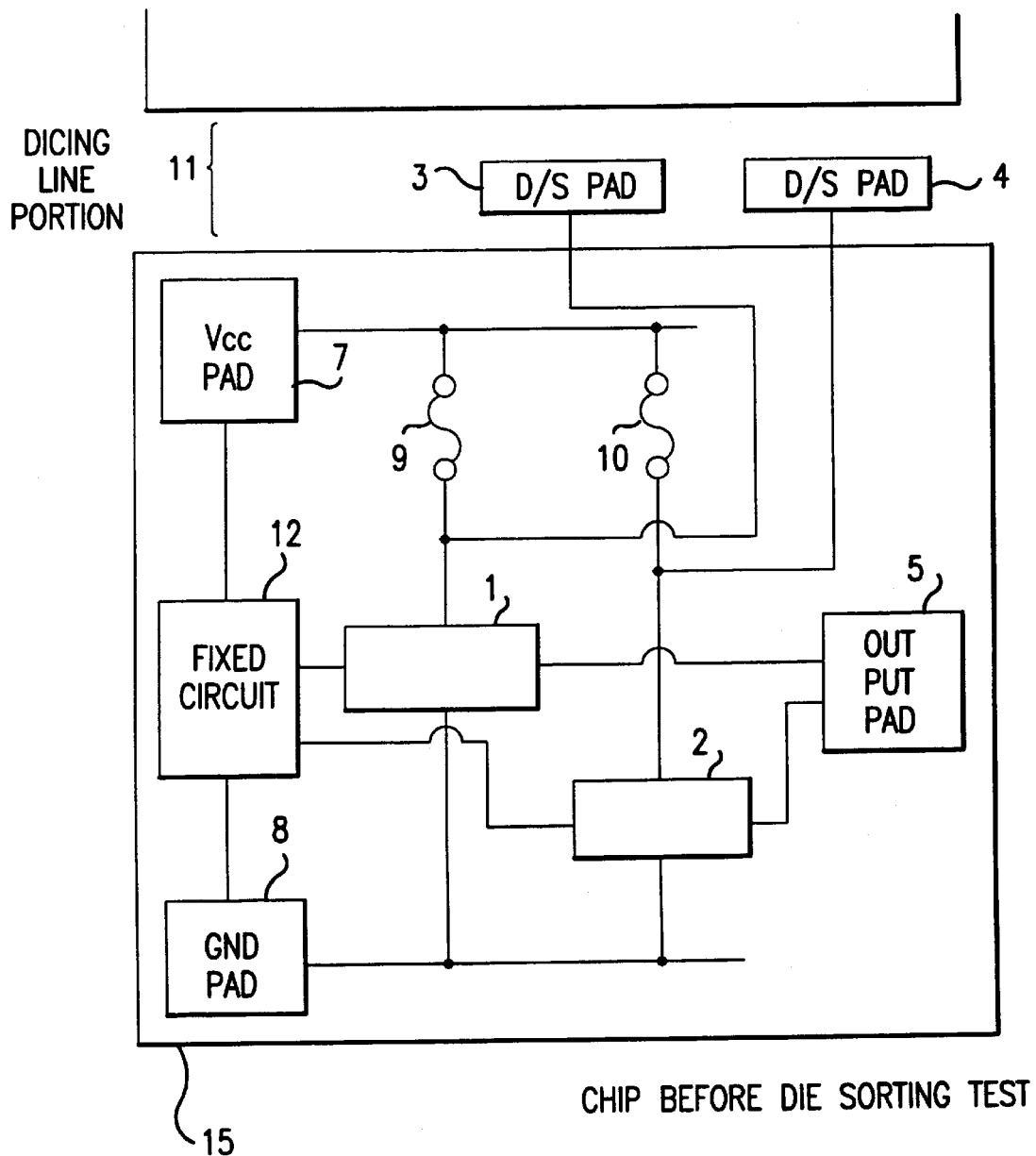
FIG. 2 is a schematic diagram of a semiconductor device according to a first embodiment of the present invention.

Various embodiments of the present invention will be described referring to the drawings. FIG. 2 is a schematic diagram illustrating the arrangement of internal circuits and die/sort pads in a semiconductor device according to a first embodiment of the present invention.

The semiconductor device according to the first embodiment of the present invention has, on a semiconductor chip 15, two different circuits (or modules) 1 and 2 having independent functions or characteristics A and B. The semiconductor device also has a VCC pad 7 connected to the circuits 1 and 2 through aluminum fuses 9 and 10; a GND pad 8 connected to the circuits 1 and 2; die/sort (DIS) pads 3 and 4 connected to one end of the fuses 9 and 10, respectively, in a dicing line portion 11; an output pad 5 connected to both the circuits 1 and 2; and a fixed circuit 12 connected to the circuits 1 and 2.

Wiring and fuses 9 and 10 connecting the circuits 1 and 2 and the pads 5, 7 and 8 are the first aluminum layer wiring formed on the semiconductor chip 15. Further, the circuits 1 and 2 having-characteristics A and B, respectively, may include, for example, transistor elements which differ in characteristics, resistive elements which differ in resistance values, capacitive elements which differ in capacitance values, or circuits having a certain function formed by their combination. For purposes of explaining the present invention, it is assumed that a semiconductor device having one of the characteristics A and B is required. In the preferred embodiment, the fixed circuit 12 (or a common circuit) includes a set of circuits which collectively meet a customized specification requested by a user.

In the semiconductor device of the above-described construction, when a user requested specification requires a construction of a circuit 1 having function A, for example, the circuit 2 having function B is no longer necessary and thus can be eliminated. However, the circuits 1 and 2 are initially connected to the common output pad 5, thereby interfering with the normal operation of the fixed circuit 12 and the circuit 1 to produce a desired output at the output pad 5. Therefore, it is necessary to disable the circuit 2 to reduce the adverse loading effects at the output pad 5.

Preferably, during the manufacture of the semiconductor device, a die sorting test is performed using a tester in order is to evaluate the characteristics of the manufactured circuit element (to determine whether or not the circuit element or module is acceptable). The die sorting test is preferably performed before the dicing step, but after the completion of the wiring step. During the test, a power supply voltage is applied to the VCC pad 7 for a predetermined time period (for example, several minutes) required to obtain the measurement for each semiconductor chip by a feeding operation of a prober, to evaluate the characteristics of the internal circuit.

Figure 3:
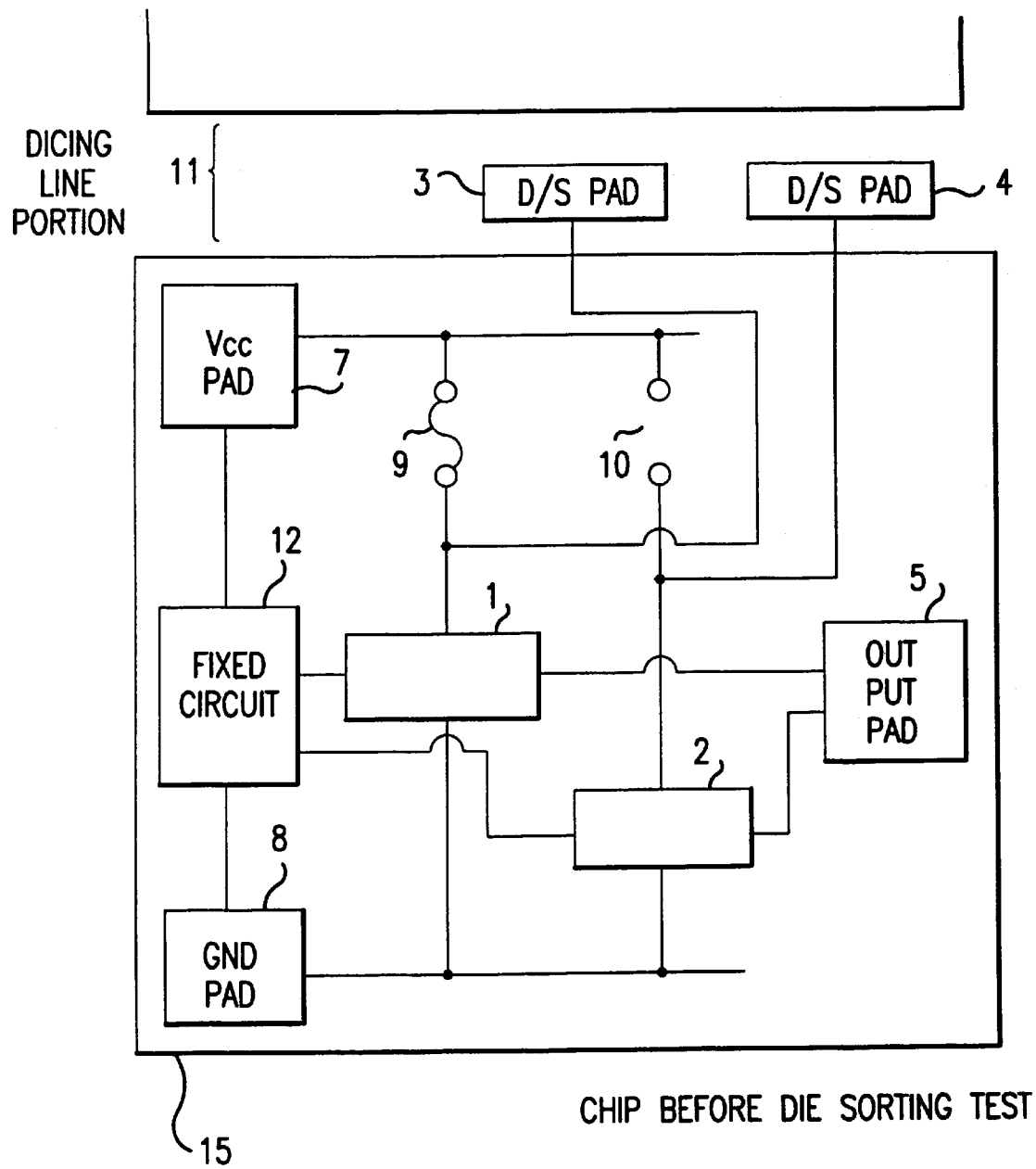
FIG. 3 is a schematic diagram of a semiconductor device after disconnecting a fuse.

In the first embodiment of the present invention, a measurement program of the tester is programmed so that the die/sort pad 4 is first grounded before the characteristics of the internal circuits are evaluated. More specifically, in the die sorting test, to evaluate the characteristics of the internal circuits of the semiconductor chip 15, a terminal of the tester having a ground voltage is brought into contact with the die/sort pad 4 after a power supply voltage is supplied to the VCC pad 7. As a result, the power supply current flows from the VCC pad 7 to the die/sort pad 4 disconnecting the fuse 10 almost instantaneously, such as within tens to hundreds of milliseconds. As a result, the circuit 2 is disconnected from the VCC pad 7 and is made inoperable, and the circuit configuration shown in FIG. 3 is obtained. Consequently, only the circuit 1 enters the operating state and the performance characteristics are evaluated by the tester.

The measurement program of the tester can be programmed so that the measurement sequence of the internal circuits is initiated only after a time period required to disconnect the circuit 2 has elapsed. Incidentally, the circuit 2 can be timely disconnected from the power source without any significant increase in the test time.

Figure 4:
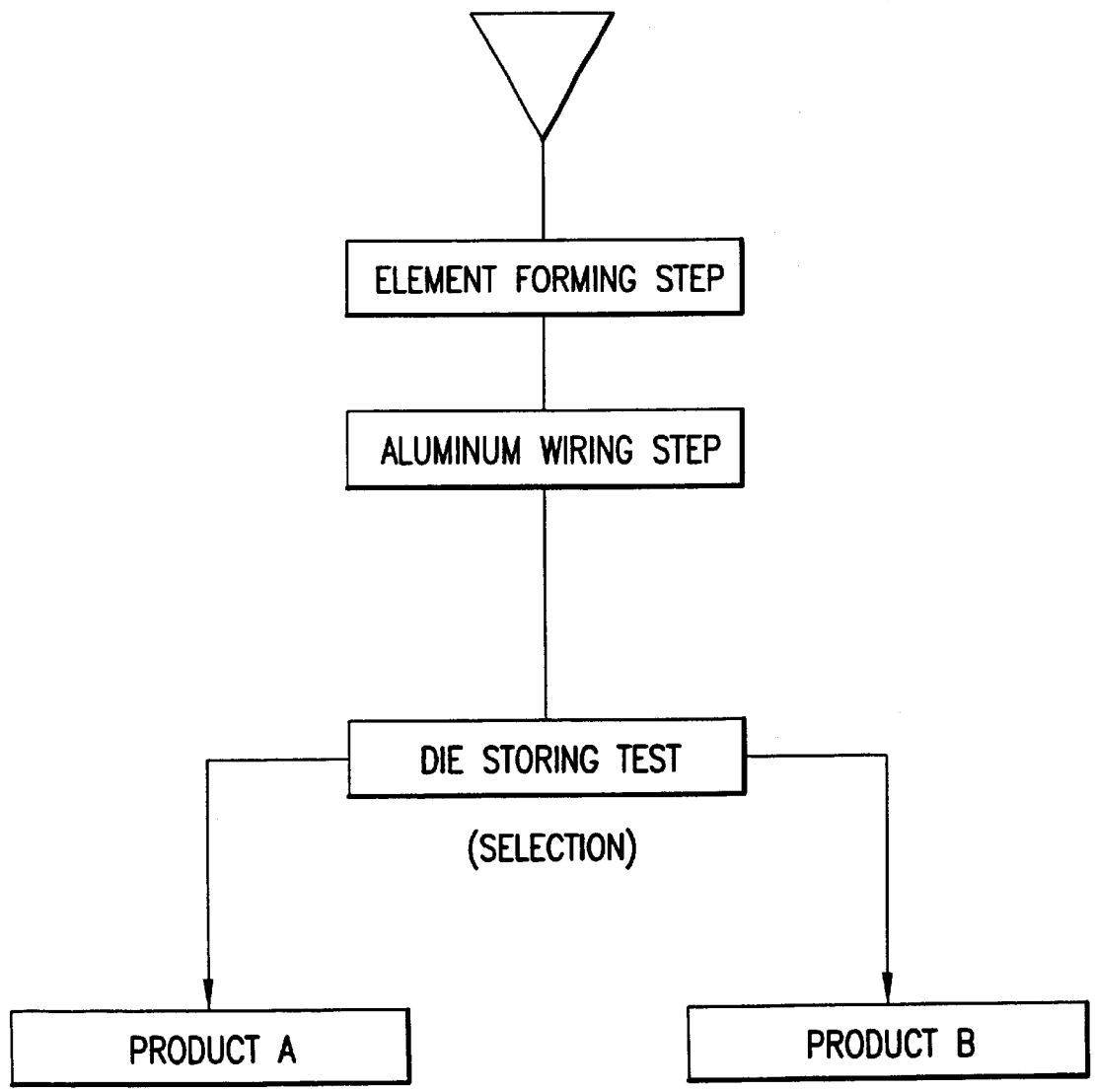
FIG. 4 is a flow chart showing the manufacturing steps of a semiconductor device according to the present invention.

As described above, according to the first embodiment of the present invention, the circuit 1 having function A based on the specifications provided by one user and the circuit 2 with the function B based on the specifications provided by another user are collectively designed and manufactured on a single die. After the completion of the aluminum wiring step, to evaluate the circuit characteristics before the dicing step, the first embodiment of the present invention allows the selection of either the circuit 1 or the circuit 2. After the selection process, the die sorting test of the selected circuit is performed without a significant increase in manufacturing time. As shown in the flow chart of FIG. 4, both the circuit 1 having function A and the circuit 2 having function B are manufactured by the same manufacturing steps until the wiring step is carried out. In the die sorting test step, either the circuit 1 or the circuit 2 is selected depending on the type of product to be manufactured.

As a result, the steps for forming an aluminum wiring mask meeting the customized requirements of the users and for selecting the circuit for each product before the wiring step are eliminated. Instead, a common aluminum wiring mask can be used for each group of custom-designed products. Moreover, designed circuits can be selected for each product at the time of the die sorting test. Therefore, it is possible to reduce the manufacturing costs and time.

Figure 5:
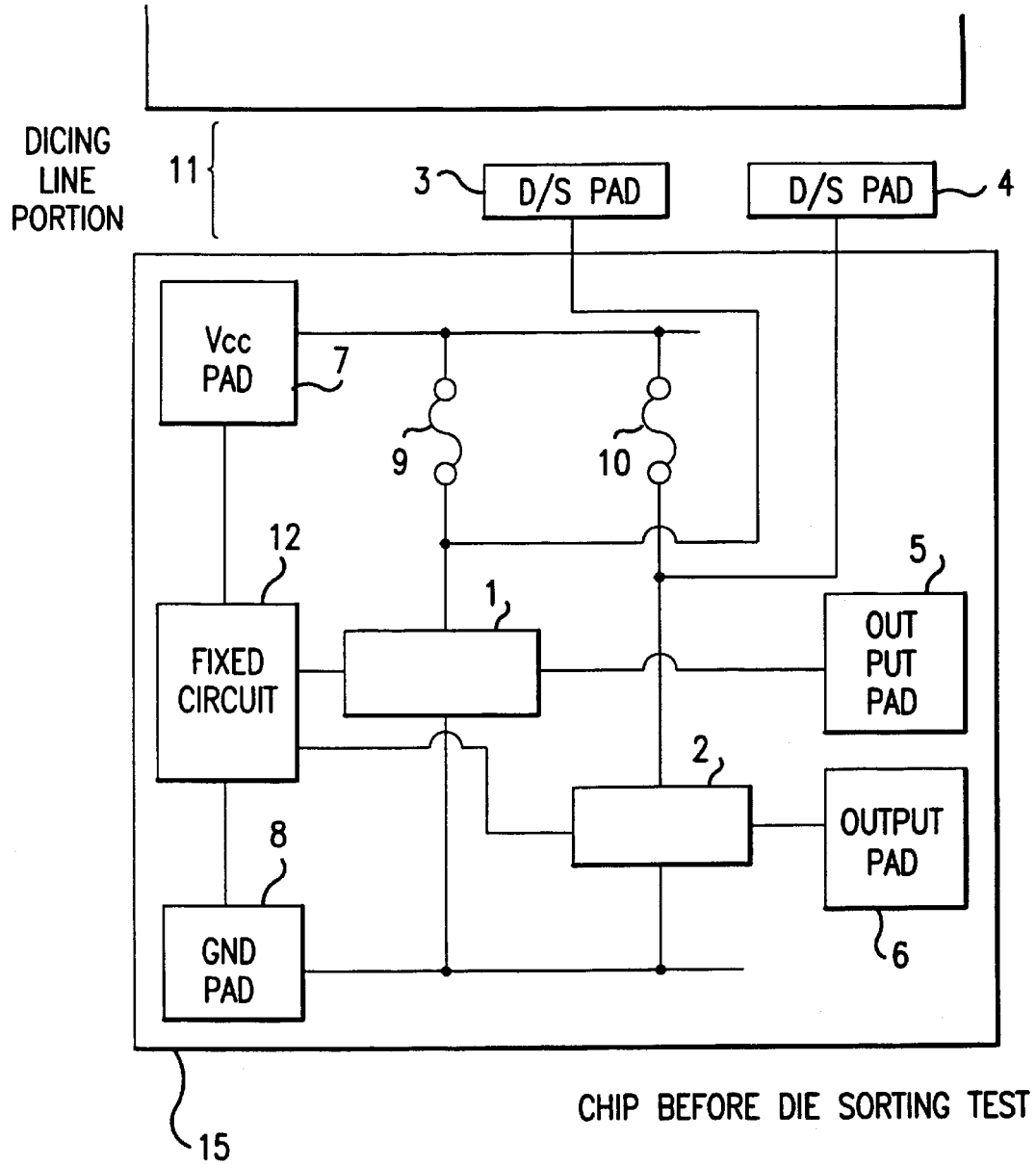
FIG. 5 is a schematic diagram of a semiconductor device according to a second embodiment of the present invention.

A second embodiment of the present invention will be described with reference to FIG. 5. In FIG. 5, the same components as those in the first embodiment are assigned the same reference numerals as those shown in FIG. 2. Hence, the description related to the same elements will not be repeated.

In the first embodiment, the circuits 1 and 2 are connected to the common output pad 5. Even after the circuit 2 is disconnected, the load of the output may, in some cases, be slightly increased due to the loading of the circuit 2. In order to solve this problem, separate output pads are formed for the circuits 1 and 2.

In FIG. 5, a VCC pad 7 for supplying a voltage is made common to all internal circuits. However, an output of circuit 1 having function A and an output of circuit 2 having function B are connected to output pads 5 and 6, respectively. The second embodiment is particularly useful in digital circuits having a small number of output pads or in analog circuits having characteristics which can be evaluated by a die sorting test.

In the second embodiment of the present invention, if a power supply voltage is applied to the VCC pad 7, all circuits formed on a semiconductor chip enter an operating state, without interfering with each other. As a result, even an unnecessary circuit enters an operating state increasing the power consumption. In some cases, both output pads 5 and 6, may be bonded during the bonding step. Therefore, a semiconductor device having a function which is not required for a particular application may also be supplied to the user.

A die/sort pad corresponding to an unnecessary circuit element may be grounded to disconnect the unnecessary or unselected circuit element. As a result, the excess power consumed by the unnecessary circuit element may be eliminated. At the same time, it is possible to provide a semiconductor device having only the function required by a user.

In the second embodiment, measuring terminals of a tester can be connected to the output pads 5 and 6, respectively, when performing the die sorting test. For example, it is possible to simultaneously disconnect a fuse 10 and evaluate the characteristics of the internal circuits having only the circuit 1. The die sorting test can be easily realized by programming a measuring program.

The second embodiment of the present invention differs from the first embodiment in that an extra load, for example circuit 2, is not connected to an output pad 5. Therefore, in the second embodiment, better circuit performance can be obtained. As a result, the second embodiment is particularly useful in the analog circuits.

The present invention is not limited to the above-described embodiments. Although the above describes a semiconductor device having two differently functioning circuits, the present invention is also applicable to manufacturing a device having three or more functions based on customized specifications. In such cases, a function corresponding to the specification requested by a user may be formed on a semiconductor chip 15, leaving only a circuit required by the user during the die sorting test step. In embodiments of the present invention, as the demand for manufacturing semiconductor devices having different specifications is increased, the productivity also improves as a result of a shortened turnaround time and reduced manufacturing costs. Although the chip size may be increased due to additional circuits, the benefit of reduced manufacturing time and improved performance is substantial.

Although in the above-mentioned embodiments, description was provided in which the number of VCC pads was one, the number of VCC pads may be two or more depending on the power requirement of internal circuits. Moreover, a pad through which a current for disconnecting a fuse may be provided either on a dicing line or on a semiconductor chip as a die/sort pad. Further, a voltage applied to the VCC pad for disconnecting the fuse need not necessarily be a common power supply voltage used for the entire device. Instead, an alternative voltage more suitable for the disconnection of the fuse may be used. In such a case, a voltage supplied to the VCC pad is changed into a normal power supply voltage after the disconnection of the fuse 10, so that the tester can evaluate the operating characteristics of the internal circuits.

In the above description, the die/sort pads 3 and 4 used for disconnecting either the circuit 1 or 2 are formed on the dicing line portion 11, outside of the semiconductor chip is. Consequently, the necessity of extra chip area in the semiconductor clip 15 required to perform the disconnecting operation of unused circuit elements can be eliminated. This is particularly beneficial in present technology where the chip size may be restricted by the number of input-output pads rather than the number of internal circuits. Under such conditions, the reduction in the number of output pads and providing die/sort pads for disconnecting a necessary circuit block in a dicing line portion as in the above-described embodiments is significantly effective to reduce the chip area. Alternatively, when there is sufficient space on the chip 15, the die/sort pads 3 and 4 may be formed not on the dicing line portion 11, but in the semicondutor chip 15.

Furthermore, in the above-described embodiments, all of the fuses 9 and 10 may be fabricated by aluminum, polycrystalline silicon film, or other suitable materials using suitable techniques, such as a sputtering method. In addition, the fuses 9 and 10 can be almost instantaneously disconnected by applying a voltage by making the cross-sectional areas of the fuses 9 and 10 smaller than that of the other wiring portions.

Furthermore, in the above-described embodiments, it is also possible to connect output transistors having high driving capability to a common output pad, and connect output transistors having low driving capability to different output pads. In such a manner, it is possible to reduce the number of output pads as a whole, and reduce excess loading caused by the common output pad.

Alternatively, instead of just having output pads to circuits 1 and 2, the present invention is also applicable to such embodiments having input pads to internal circuits 1 and 2.

Although in the above-mentioned embodiment, the fuses are connected between the VCC pad 7 and the circuits 1 and 2, they may be connected between the GND pad and the circuits 1 and 2. The other end of the fuse is connected to a die/sort pad. In this embodiment, a voltage may be applied to the die/sort pad to disconnect the fuse.

According to the semiconductor device in the present invention, it is possible to manufacture a semiconductor device having a desired characteristic at a reduced cost and time.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of manufacturing a semiconductor device on a semiconductor ship, the method comprising the steps of:
    fabricating first and second selectable modules, the first selectable module performing a first circuit function, the second selectable module performing a second circuit function different than the first circuit function, and both the first and second selectable modules being operational;
    fabricating a voltage pad for supplying source power to the selectable modules;
    fabricating a power supplying wiring from the voltage pad to each selectable module, wherein the power supplying wiring includes a fuse for each corresponding selectable module;

fabricating a plurality of die/sort pads, each die/sort pad being connected to a corresponding fuse; and supplying a predetermined voltage to at least one of the die/sort pads to disconnect the corresponding fuse, so that the selectable module corresponding to the disconnected fuse becomes inoperable.

2. The method of claim 1, wherein each fuse has a smaller cross-sectional area than other portions of the power supplying wiring.

3. The method of claim 1, wherein the die/sort pads are formed on a dicing line.

4. The method of claim 1, wherein the step of disconnecting the fuse is performed during a die sorting test.

5. The method of claim 4, wherein operating characteristics of the selectable modules are evaluated after disconnecting the fuse.

6. The method of claim 1, wherein the predetermined voltage is at a first voltage level when the source power is at a first voltage, and the predetermined voltage is at a second voltage level when the source power is at a second voltage.

7. A method of manufacturing a semiconductor device on a semiconductor chip, the method comprising the steps of:

fabricating first and second selectable modules on the semiconductor chip, each of the selectable modules having an input power terminal, the first selectable module performing a first circuit function, the second selectable module performing a second circuit function different than the first circuit function, and both the first and second selectable modules being operational;

fabricating a voltage pad for connection with a first voltage source having a first voltage level;

fabricating an output pad connected to the selectable modules;

fabricating a plurality of die/sort pads; and fabricating a plurality of fuses, each fuse having first and second terminals, the first terminal being connected to the input power terminal of the corresponding selectable module and to a corresponding one of the die/sort pads, and the second terminal of the fuse being connected to the voltage pad, wherein at least one of the first and second selectable modules is rendered inoperable by disconnecting the fuse of the at least one selectable module by applying to the corresponding die/sort pad a second voltage source having a second voltage level.

8. A method of manufacturing a semiconductor device, the method comprising the steps of:

connecting first and second selectable modules to a voltage pad via corresponding voltage supply wirings, each selectable module having an output, the first selectable module performing a first circuit function, the second selectable module performing a second circuit function different than the first circuit function, and both the first and second selectable modules being operational;

connecting each output of the selectable modules to an output pad;

fabricating a plurality of die/sort pads, each die/sort pad being connected to a corresponding selectable module to form a corresponding node;

fabricating a fuse in each of the voltage supplying wirings between the voltage pad and a corresponding node; and grounding the die/sort pad so that at least one of the plurality of selectable modules is rendered inoperable by disconnecting the fuse of the at least one selectable module.

9. The method of claim 1, wherein the first and second selectable modules are electrically coupled in parallel with respect to input-to-out signal flow of the semiconductor device.

10. The method of claim 7, wherein the first and second selectable modules are electrically coupled in parallel with respect to input-to-out signal flow of the semiconductor device.

11. The method of claim 8, wherein the first and second selectable modules are electrically coupled in parallel with respect to input-to-out signal flow of the semiconductor device.

* * * * *